(12) United States Patent
Greene et al.

(10) Patent No.: US 9,349,609 B2
(45) Date of Patent: May 24, 2016

(54) SEMICONDUCTOR PROCESS TEMPERATURE OPTIMIZATION

(71) Applicant: International Business Machines Corporation, Armonk, NY (US)

(72) Inventors: Brian J. Greene, Fishkill, NY (US); Yue Liang, Sunnyvale, CA (US); Xiaojun Yu, Sunnyvale, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 177 days.

(21) Appl. No.: 14/230,065

(22) Filed: Mar. 31, 2014

(65) Prior Publication Data
US 2015/0279692 A1   Oct. 1, 2015

(51) Int. Cl.
    *H01L 21/324*     (2006.01)
    *H01L 21/3205*    (2006.01)
    *H01L 29/66*      (2006.01)

(52) U.S. Cl.
    CPC ........ *H01L 21/324* (2013.01); *H01L 21/32051* (2013.01); *H01L 21/32055* (2013.01); *H01L 29/66545* (2013.01)

(58) Field of Classification Search
    CPC ................. H01L 27/3223; H01L 29/66545; H01L 29/66871
    See application file for complete search history.

(56) References Cited

U.S. PATENT DOCUMENTS

| 6,300,208 | B1 | 10/2001 | Talwar et al. |
|---|---|---|---|
| 6,635,541 | B1 | 10/2003 | Talwar et al. |
| 7,759,773 | B2 | 7/2010 | Anderson et al. |
| 8,080,485 | B2 | 12/2011 | Anderson et al. |
| 8,138,105 | B2 | 3/2012 | Timans |
| 2007/0089773 | A1* | 4/2007 | Koester .................... H01L 35/34 136/230 |
| 2007/0218644 | A1* | 9/2007 | Balakrishna ...... H01L 21/26506 438/420 |
| 2015/0235920 | A1* | 8/2015 | Skinner ................. H01L 23/467 257/692 |

OTHER PUBLICATIONS

Offord et al., "Laser-Assisted Fabrication of Bipolar Transistors in Silicon-On-Sapphire (SOS)", United States Statutory Invention Registration, Reg. No. H1637, Published Mar. 4, 1997.

Sanganeria et al., "Application of Constant Absorptivity Ring (CAR) to Improve Polysilicon Thickness Uniformity in a Rapid Thermal Chemical Vapor Deposition Reactor", Materials Research Society Symposium Proceedings, vol. 303, Rapid Thermal Integrated Processing II, Symposium held Apr. 12-15, 1993, pp. 19-23.

(Continued)

*Primary Examiner* — Mohammad Choudhry
(74) *Attorney, Agent, or Firm* — Yuanmin Cai, Esq.

(57) ABSTRACT

A method including forming a structure including a plurality of semiconductor devices surrounded by a dielectric layer such that a top surface of the dielectric layer is substantially flush with a top surface of the plurality of semiconductor devices, depositing a thermal optimization layer above the structure, patterning the thermal optimization layer such that a portion of the thermal optimization layer is removed from a above first region of the structure and another portion of the thermal optimization layer remains above a second region of the structure, the first region having a different thermal conductivity than the second region, and heating the structure, the patterned thermal optimization layer causing substantially uniform thermal absorption of the structure.

14 Claims, 5 Drawing Sheets

(56) References Cited

OTHER PUBLICATIONS

Venturini et al., "Integration of a Long Pulse Laser Thermal Process for Ultra Shallow Junction Formation of CMOS Devices", 12th IEEE International Conference on Advanced Thermal Processing of Semiconductors—RTP2004, pp. 73-78.

Wong et al., "Microscale Radiation Effects in Multilayer Thin-Film Structures During Rapid Thermal Processing", Materials Research Society Symposium Proceedings vol. 303, Rapid Thermal and Integrated Processing II, Symposium held Apr. 12-15, 1993, pp. 217-222.

* cited by examiner

SEMICONDUCTOR PROCESS TEMPERATURE OPTIMIZATION

BACKGROUND

The present invention generally relates to semiconductor fabrication, and more particularly, to process uniformity control with respect to thermal absorption during fabrication.

Strategic placement of dummy structures in semiconductor design can be used to control process uniformity within a semiconductor wafer. More specifically, dummy structures added to the white space, or non-active regions, of a wafer can be used to control thermal absorption and reduce temperature variations across a wafer during heating techniques used during fabrication. Addition of the dummy structures affects the net thermal conductivity of the entire wafer, in turn affecting the net thermal absorption by the wafer during fabrication.

The dummy structures may typically be integrated into standard process flows and are fabricated adjacent to active devices using similar process techniques used to fabricate the active devices. Because they can be integrated into standard process flows, the dummy structures must be designed to meet uniformity requirements for optimal chemical mechanical polish, epitaxial growth, spacer dielectric deposition, and thermal absorption uniformity. In other words, integrating the dummy structures into standard process flows affect more than just the thermal absorption of the wafer, but can also affect other processing techniques.

As such, the process uniformity strategy has evolved into a complex multi-variable optimization which, due to the number of design levels involved, is often expensive and difficult to validate the alternative optimization strategies on a finished product.

SUMMARY

According to an embodiment of the present invention, a method is provided. The method may include forming a structure including a plurality of semiconductor devices surrounded by a dielectric layer such that a top surface of the dielectric layer is substantially flush with a top surface of the plurality of semiconductor devices, depositing a thermal optimization layer above the structure, patterning the thermal optimization layer such that a portion of the thermal optimization layer is removed from a above first region of the structure and another portion of the thermal optimization layer remains above a second region of the structure, the first region having a different thermal conductivity than the second region, and heating the structure, the patterned thermal optimization layer causing substantially uniform thermal absorption of the structure.

According to another exemplary embodiment of the present invention, a method is provided. The method may include forming a structure including a plurality of semiconductor devices, depositing a dielectric layer between the plurality of semiconductor devices, polishing the dielectric layer flush with a top of the plurality of semiconductor devices, and depositing a thermal optimization layer above the plurality of semiconductor devices and above the dielectric layer. The method may further include patterning the thermal optimization layer such that a portion of the thermal optimization layer is removed from above a first region of the structure and another portion of the thermal optimization layer remains above a second region of the structure, the first region having a different thermal conductivity than the second region, heating the structure, the patterned thermal optimization layer causing substantially uniform thermal absorption of the structure, removing the thermal optimization layer, and replacing the dummy gate with a metal gate.

According to another exemplary embodiment of the present invention, a method is provided. The method may include heating a semiconductor structure to a substantially uniform temperature during fabrication, the substantially uniform temperature achieved by selectively placing a sacrificial material on the semiconductor structure, the sacrificial material used to absorb or reflect thermal energy during heating.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor fabrication, and more particularly to, process uniformity control with respect to thermal absorption during fabrication. The thermal absorption uniformity may be limited to a dedicated and disposable process level. This disposable process level can be tuned independently to optimize cross-chip thermal absorption, or to manipulate the internal chip thermal absorption to strategically compensate for internal chip non-uniformities established elsewhere in the process flow. One way to optimize cross-chip thermal absorption may include depositing and patterning a sacrificial thermal optimization layer during manufacturing. An embodiment by which to optimize cross-chip thermal absorption using the sacrificial thermal optimization layer (hereinafter "thermal optimization layer") is described in detail below by referring to the accompanying drawings FIGS. 1-7.

Referring now to FIGS. 1-4, exemplary process steps of forming a structure in accordance with an embodiment of the present invention are shown, and will now be described in greater detail below.

Figure 1:
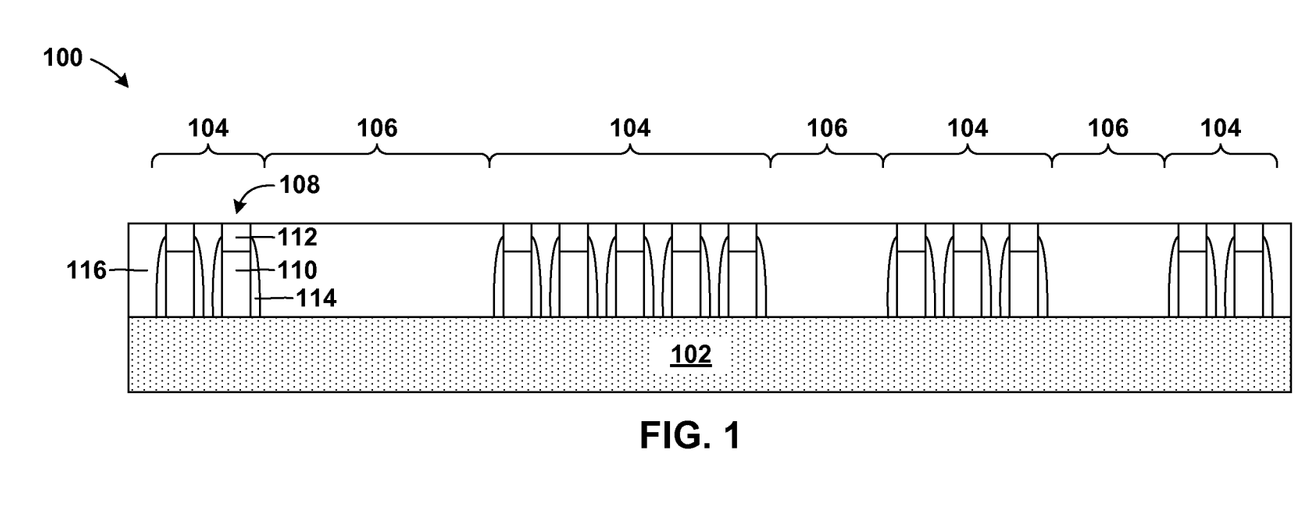
FIG. 1 is a cross-sectional view of a structure at an intermediate step of fabrication in which one or more semiconductor devices are formed above a substrate according to an exemplary embodiment.

FIG. 1 is a demonstrative illustration of a structure during an intermediate step of a method of optimizing cross-chip thermal absorption according to an embodiment. More specifically, the method can start with forming a structure 100 having one or more semiconductor devices (hereinafter "devices") fabricated on a semiconductor substrate 102 (hereinafter "substrate"). Some non-limiting examples of the devices can include, for example, a transistor, a capacitor, a diode, or any known device fabricated from semiconducting materials. Generally, the devices are formed in active regions 104 of the substrate 102. Any remaining space between active regions 104 of the substrate 102 may be referred to as white space 106 or non-active regions.

The substrate 102 may include any known bulk semiconductor or layered semiconductor such as Si/SiGe, a silicon-on-insulator (SOI), or a SiGe-on-insulator (SGOI). Examples of bulk semiconductor substrate materials may include undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. A bulk semiconductor substrate may be relied upon for purposes of this description.

In an embodiment, as illustrated in the figures, the devices may include a field effect transistor 108 (hereinafter "FET"), such as a finFET or a planar FET. The FET 108 can generally be fabricated using known techniques, such as for example, a gate first or a gate last process flow. For purposes of this description, a gate last process flow will be relied upon. In such cases at this stage of fabrication, the FET 108 may generally include a dummy gate 110 and a gate cap 112 surrounded on at least two sides by a pair of sidewall spacers 114.

The structure 100 may also include a dielectric layer 116, also commonly referred to as an inter-level dielectric layer. The dielectric layer 116 may be blanket deposited on the substrate 102 after the devices are formed. The dielectric layer 116 may fill the white space 106 between the active regions 104. A chemical mechanical polishing technique can be used to generate a smooth and flat surface in preparation for subsequent processing techniques.

Figure 2:
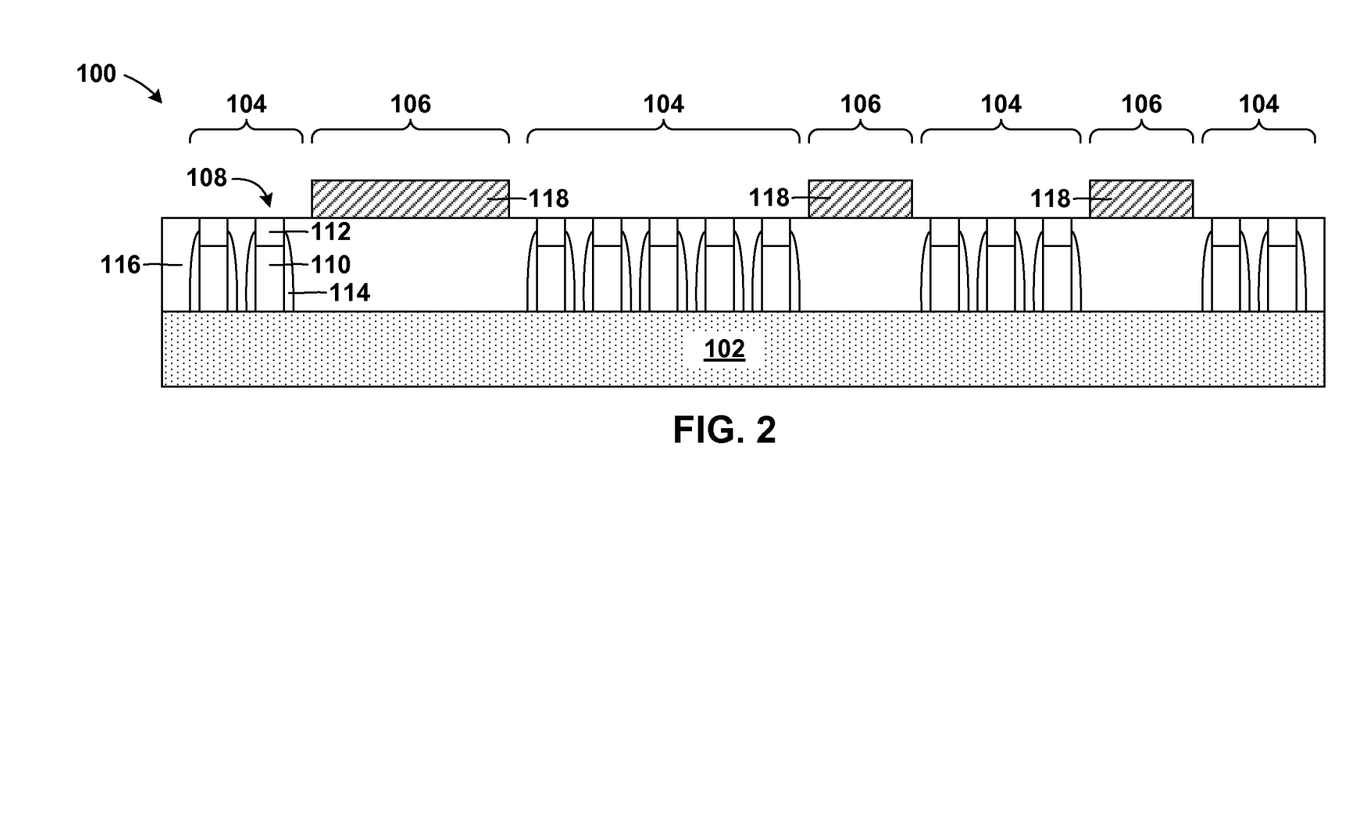
FIG. 2 illustrates forming and patterning a thermal optimization layer above the semiconductor devices according to an exemplary embodiment.

FIG. 2 is a demonstrative illustration of the structure 100 during an intermediate step of a method of optimizing cross-chip thermal absorption according to an embodiment. More specifically, the method can include depositing and patterning a thermal optimization layer 118 above the structure 100 to achieve thermal uniformity across the structure 100. Any known techniques can be used to deposit and pattern the thermal optimization layer 118. In an embodiment, the thermal optimization layer 118 is preferably a sacrificial layer which may be subsequently removed after thermal treatment is complete.

Variations in pattern density, perimeter density, and reflectivity can all induce significant local temperature variation during various heating techniques, such as, rapid thermal annealing techniques, commonly used during the fabrication process. These temperature variations can reduce effective fabrication process windows, and cause sub-optimal chip power and performance.

The thermal optimization layer 118 can be used to optimize cross-chip thermal absorption and achieve thermal absorption uniformity by modifying the net thermal conductivity of the structure 100 during typical heating techniques used for semiconductor fabrication. The net thermal conductivity of the structure 100 can be described as the overall ability of the materials of the structure 100, collectively, to conduct heat. Heat transfer occurs at a higher rate across materials of high thermal conductivity than across materials of low thermal conductivity. The different materials of the structure 100 have different thermal conductance properties and as such will conduct heat at different rates. For example, the active regions 104 are composed of different materials than the white space 106, and as such each will conduct heat at different rates.

The thermal optimization layer 118 can include any material capable of reflecting or absorbing thermal energy during subsequent fabrication techniques, such as, for example, a heating or annealing technique. Stated differently, the thermal optimization layer 118 may include materials having a relatively high thermal conductivity or a relatively low thermal conductivity. More specifically, the thermal optimization layer 118 may have a relatively high thermal conductivity or a relatively low thermal conductivity with respect to the thermal conductivity of a local region of the structure 100 where the thermal optimization layer 118 is placed. For example, a thermal optimization layer having a relatively low thermal conductivity may be placed above a region of the structure 100 having a relatively high net thermal conductivity, and vice versa.

In practice, a thermal optimization layer having a relatively low thermal conductivity can be used to decrease the rate of thermal absorption, or decrease the heat transfer rate, of a particular region of the structure 100 during heating. On the other hand, a thermal optimization layer having a relatively high thermal conductivity can be used to increase the rate of thermal absorption, or increase the heat transfer rate, of a particular region of the structure 100 during heating. The net result of heating the structure 100 with the thermal optimization layer 118 being thermal absorption uniformity.

In an embodiment, a thermal optimization layer having a relatively high thermal conductivity may include, for example, amorphous silicon, amorphous carbon, silicon nitride, or some combination thereof. In another embodiment, a thermal optimization layer having a relatively low thermal conductivity and may include, for example, a refractory metal. In general, a refractory metal can have a relatively low thermal conductivity and may be used to reflect thermal energy, while amorphous silicon can have a relatively high thermal conductivity and may be used to absorb thermal energy.

Generally, the thickness of the thermal optimization layer 118 can affect the rate of thermal conduction (i.e. how fast a particular mass will absorb or release heat). In principle, the larger the mass, the slower it will absorb or release heat. Therefore, in general, a relatively thick thermal optimization layer 118 will have more mass, and as such, can conduct thermal energy slower than a relatively thin thermal optimization layer. The optimal thickness of the thermal optimization layer 118 is a function of the thermal conductivity of all the present materials of the structure 100, and how long the structure 100 will undergo heating or annealing. For example, a relatively thick thermal optimization layer can be used to achieve thermal absorption uniformity during longer heating times. Similarly, a relatively thin thermal optimization layer can be used to achieve thermal absorption uniformity during shorter heating times. It should be noted that thermal absorption uniformity may not be achieved if the thermal optimization layer is too thin or too thick. For example, a relatively thin thermal optimization layer can have only a very subtle effect on the net thermal conductivity of individual regions of the structure 100. Similarly, a relatively thick thermal optimization layer can have a very severe effect on the net thermal conductivity of individual regions of the structure 100.

In an embodiment, the thermal optimization layer 118 can have a thickness equal to or greater than about 5 nm. For most semiconductor fabrication heating techniques, a thickness less than 5 nm may not provide the desired function. In an embodiment, the thermal optimization layer 118 can have a thickness ranging from about 5 nm to about 100 nm. In an embodiment, the thickness of the thermal optimization layer 118 can be approximately 10% of the thickness of the underlying structure.

The thickness and composition of the thermal optimization layer 118 can also be dependant in part on the particular heating technique used, and as such, may be specifically matched to the particular heating technique, based on the heat source and the time-temperature profile. For example, a rapid thermal anneal technique commonly used in the fabrication of semiconductor structures like the structure 100 can be used for a wide variety of applications, including dopant activation, thermal oxidation, metal reflow and chemical vapor deposition. The rapid thermal anneal technique can be used to heat the structure 100 to high temperatures (up to 1,200° C. or greater) on a timescale of several seconds or less. Such rapid heating rates are often attained by high intensity lamps or lasers. To achieve the short time annealing times, a trade off is made in process uniformity, temperature uniformity, temperature measurement, temperature control and wafer stress as well as throughput. The addition of the thermal optimization layer 118 may work to eliminate or reduce some of the aforementioned trades offs.

With continued reference to FIG. 2, after the thermal optimization layer 118 is patterned, the structure 100 can preferably undergo heating or annealing as referenced above. The specific details of the annealing technique are relevant to the present disclosure in so much as they can dictate the various parameters and characteristics of the thermal optimization layer 118 discussed above. More specifically, placement, material choice, and thickness of the thermal optimization layer 118 can be selected to correspond with a particular heating technique during a particular stage of fabrication.

In fact, the structure 100 can undergo multiple heating techniques or annealing steps in the course of fabrication. The thermal optimization layer 118 may be deposited, patterned, and then removed for each of the heating techniques without permanently modifying the design of the structure 100. Multiple thermal optimization layers (118), each tailored to a different heating technique, can be used throughout one fabrication process flow.

Figure 3:
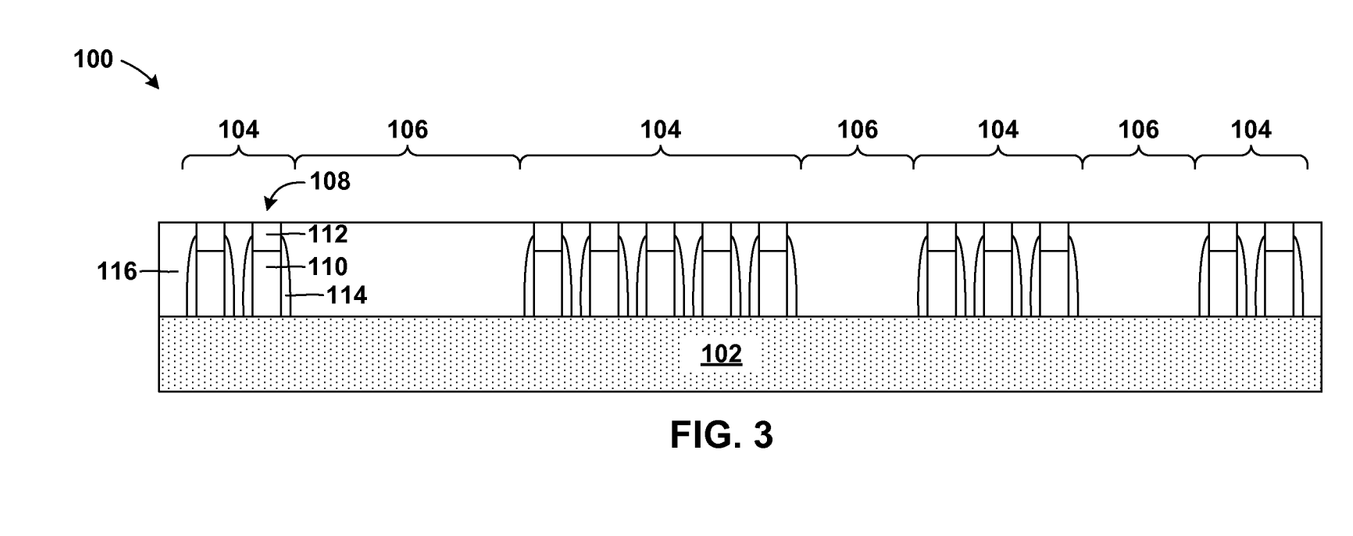
FIG. 3 illustrates removing the thermal optimization layer according to an exemplary embodiment.

FIG. 3 is a demonstrative illustration of the structure 100 during an intermediate step of a method of optimizing cross-chip thermal absorption according to an embodiment. More specifically, the method can include removing the thermal optimization layer 118 from above the structure 100 in preparation for subsequent processing. Any known removal technique, such as, for example, reactive ion etching can be used to remove the thermal optimization layer 118. It should be noted that the thermal optimization layer 118 should preferably be removed selective to any underlying materials.

Figure 4:
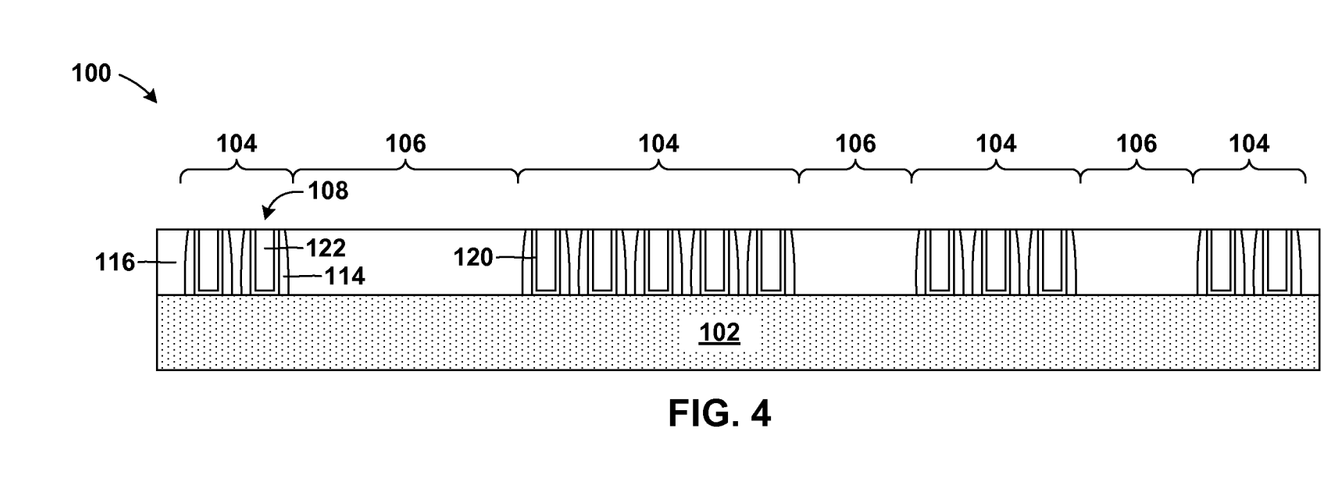
FIG. 4 illustrates replacing a dummy gate with a gate dielectric and a metal gate according to an exemplary embodiment.

FIG. 4 is a demonstrative illustration of the structure 100 during an intermediate step of a method of optimizing cross-chip thermal absorption in which the dummy gate 110 (FIG. 3) can be replaced with a gate dielectric 120 and a metal gate 122 according to an embodiment. Replacement of the dummy gate 110 (FIG. 3), as in a replacement gate process flow, is one example of subsequent processing mentioned above. The dummy gate 110 (FIG. 3) can be replaced with the gate dielectric 120 and the metal gate 122 using known practices and techniques.

Figure 5:
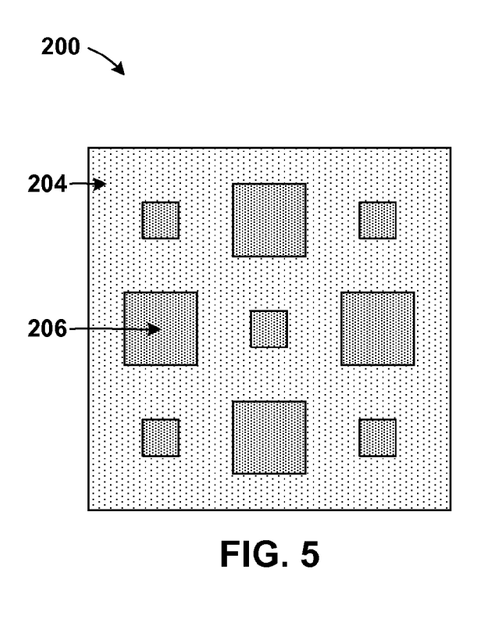
FIG. 5 illustrates a thermal map of the structure after heating the structure without the thermal optimization layer according to an exemplary embodiment.

FIG. 5 is a demonstrative illustration of a thermal map of a structure 200, without the thermal optimization layer 118 (FIG. 2), after undergoing a heating technique according to an embodiment. FIG. 5 is a top view of the structure 200 and represents the temperature differential across a top surface of the structure 200. The structure 200 is similar to the structure 100 (FIG. 1) in that it too can include active regions 204 and white space 206. In the present example, the different cross-hatching is used to represent different temperatures, and as such, the active regions 204 can have a different temperature than the white space 206 after the structure 200 is heated during fabrication. For example, during a typical annealing technique, the temperature differential between the active regions 204 and the white space 206 can range from about 1° C. to about 40° C.

Figure 6:
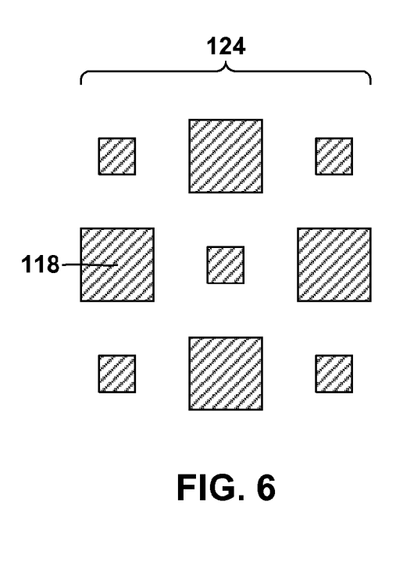
FIG. 6 illustrates a pattern of the thermal optimization layer used to optimize cross-chip thermal absorption during heating of the structure according to an exemplary embodiment.

FIG. 6 is a demonstrative illustration of a pattern 124 of a thermal optimization layer, for example the thermal optimization layer 118, used to optimize cross-chip thermal absorption during heating of a structure according to an embodiment. The pattern 124 can be designed according to the techniques and limitations described in detail above. For example, the pattern 124 in the present example corresponds with the white space 206 of the structure 200. The pattern 124 can be used to increase or decrease the heat transfer rate of white space 206 to achieve temperature uniformity across the surface of the structure 200. In another embodiment, the pattern 124 of the thermal optimization layer can alternatively correspond with the active regions 204, or some other region of the structure experiencing some amount of temperature differential.

Figure 7:
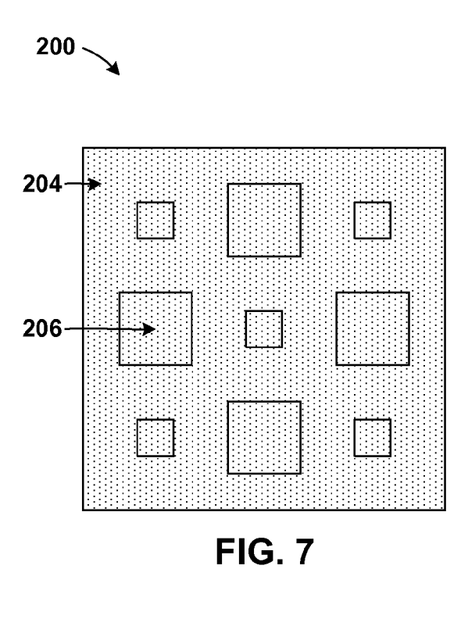
FIG. 7 illustrates a thermal map of the structure, including the thermal optimization layer, after heating according to an exemplary embodiment.

FIG. 7 is a demonstrative illustration of a thermal map of the structure 200, with the thermal optimization layer 118, after undergoing a heating technique according to an embodiment. Again, different cross-hatching is used to represent different temperatures. In the present example, after the structure 200 is heated, the temperature of the active regions 204 and the temperature of the white space 206 can be substantially similar due to the placement and use of the pattern 124 of the thermal optimization layer.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   forming a structure comprising a plurality of semiconductor devices surrounded by a dielectric layer such that a top surface of the dielectric layer is substantially flush with a top surface of the plurality of semiconductor devices;
   depositing a thermal optimization layer above the structure;
   patterning the thermal optimization layer such that a portion of the thermal optimization layer is removed from above a first region of the structure and another portion of the thermal optimization layer remains above a second region of the structure, the first region having a different thermal conductivity than the second region; and
   heating the structure, the patterned thermal optimization layer causing substantially uniform thermal absorption of the structure.

2. The method of claim 1, wherein the thermal optimization layer comprises a material that decreases a local temperature of the structure by reflecting thermal energy during heating.

3. The method of claim 1, wherein the thermal optimization layer comprises a material that increases a local temperature of the structure by absorbing thermal energy during heating.

4. The method of claim 1, wherein the thermal optimization layer comprises a refractory metal.

5. The method of claim 1, wherein the thermal optimization layer comprises amorphous silicon.

6. The method of claim 1, further comprising:
   removing the thermal optimization layer;
   removing a hardmask from above a dummy gate of the plurality of semiconductor devices; and
   replacing the dummy gate with a metal gate.

7. The method of claim 1, wherein the thermal optimization layer comprises a relatively high thermal conductivity or a relatively low thermal conductivity with respect to the thermal conductivity of a local region of the structure where the thermal optimization layer is placed.

8. A method comprising:
   forming a structure comprising a plurality of semiconductor devices;
   depositing a dielectric layer between the plurality of semiconductor devices;
   polishing the dielectric layer flush with a top of the plurality of semiconductor devices;
   depositing a thermal optimization layer above the plurality of semiconductor devices and above the dielectric layer;
   patterning the thermal optimization layer such that a portion of the thermal optimization layer is removed from above a first region of the structure and another portion of the thermal optimization layer remains above a second region of the structure, the first region having a different thermal conductivity than the second region;
   heating the structure, the patterned thermal optimization layer causing substantially uniform thermal absorption of the structure;
   removing the thermal optimization layer; and
   replacing the dummy gate with a metal gate.

9. The method of claim 8, wherein the thermal optimization layer comprises a material that reflects thermal energy during heating.

10. The method of claim 8, wherein the thermal optimization layer comprises a material that absorbs thermal energy during heating.

11. The method of claim 8, wherein the thermal optimization layer comprises a refractory metal.

12. The method of claim 8, wherein the thermal optimization layer comprises amorphous silicon.

13. The method of claim 8, wherein the thermal optimization layer comprises a relatively high thermal conductivity with respect to the thermal conductivity of a local region of the structure where the thermal optimization layer remains after being patterned.

14. The method of claim 8, wherein the thermal optimization layer comprises a relatively low thermal conductivity with respect to the thermal conductivity of a local region of the structure where the thermal optimization layer remains after being patterned.

* * * * *